(12) United States Patent
Hanai et al.

(10) Patent No.: US 6,522,126 B1
(45) Date of Patent: Feb. 18, 2003

(54) SEMICONDUCTOR TESTER, AND METHOD OF TESTING SEMICONDUCTOR USING THE SAME

(75) Inventors: Hisayoshi Hanai, Tokyo (JP);
Teruhiko Funakura, Tokyo (JP);
Yasuhiro Mabuchi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 13 days.

(21) Appl. No.: 09/684,779

(22) Filed: Oct. 10, 2000

(30) Foreign Application Priority Data

Mar. 27, 2000 (JP) .......................................... 2000-087019

(51) Int. Cl.⁷ .............................................. G01R 31/26
(52) U.S. Cl. ...................................... 324/158.1; 324/765
(58) Field of Search ............................... 324/765, 158.1; 327/184, 161, 172–177; 331/27; 714/724, 720, 719, 722

(56) References Cited

U.S. PATENT DOCUMENTS

| 5,499,280 A | * | 3/1996 | Wilson et al. ............... 327/160 |
| 5,892,384 A | * | 4/1999 | Yamada et al. .............. 327/277 |
| 6,124,743 A | * | 9/2000 | Yang .......................... 327/198 |
| 6,271,697 B1 | * | 8/2001 | Hayashi et al. ............. 327/158 |
| 6,396,357 B1 | * | 5/2002 | Sun et al. .................... 327/543 |

FOREIGN PATENT DOCUMENTS

JP           8-271593           10/1996

* cited by examiner

*Primary Examiner*—Michael Sherry
*Assistant Examiner*—Jimmy Nguyen
(74) *Attorney, Agent, or Firm*—McDermott, Will & Emery

(57) ABSTRACT

A low-cost semiconductor tester which saves memory space for storing a test pattern by means of producing a high-speed clock while preparing a test pattern at a low-speed test cycle and which has a test-pattern storage circuit of small storage capacity, as well as a semiconductor test method using the semiconductor tester. The semiconductor tester includes a reference-signal-generation circuit for producing a test cycle to be taken as a reference-signal, a waveform formation circuit for producing the geometry of an output waveform on the basis of the test cycle, and a waveform output circuit which sets the voltage of the geometry of the output waveform and applies the voltage to a semiconductor element to be measured. A ring oscillation circuit is provided in the waveform formation circuit and has a variable delay circuit. The ring oscillation circuit converts the output waveform, which waveform is produced at a predetermined timing, into a high-speed clock waveform.

6 Claims, 6 Drawing Sheets

FIG. 1
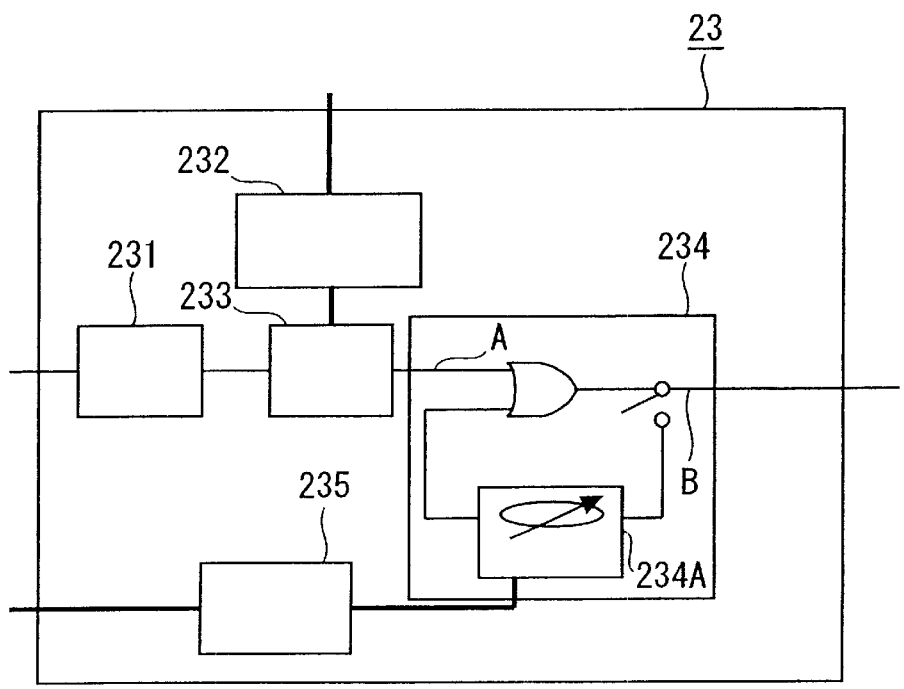
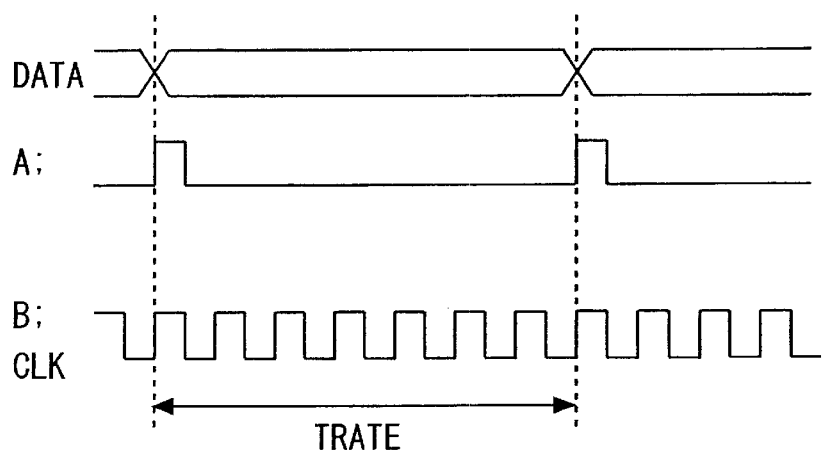
FIG. 2A  DATA
FIG. 2B  A;
FIG. 2C  B; CLK
TRATE

FIG. 3
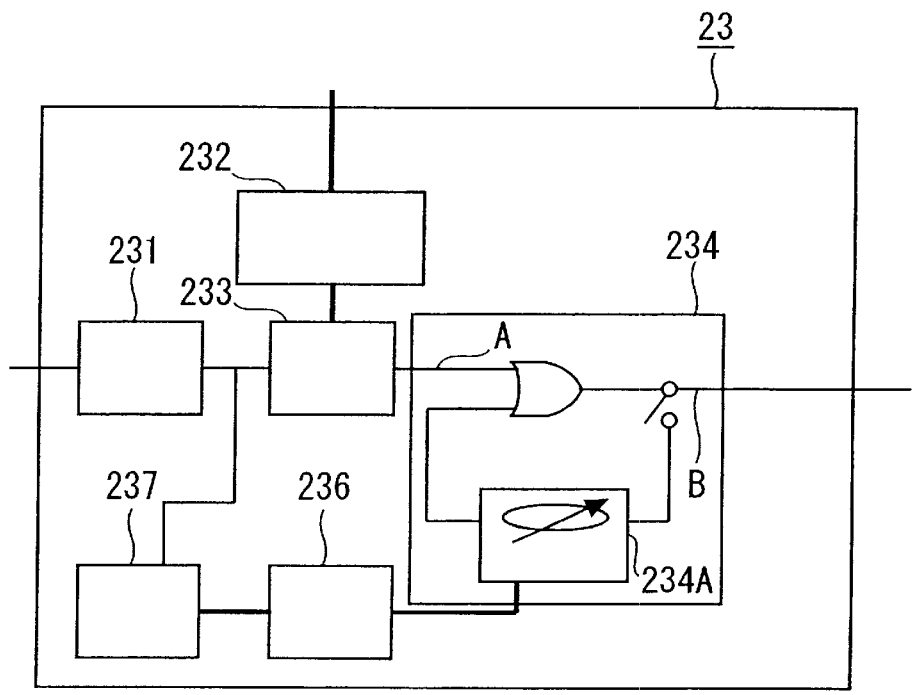
FIG. 4A  DATA 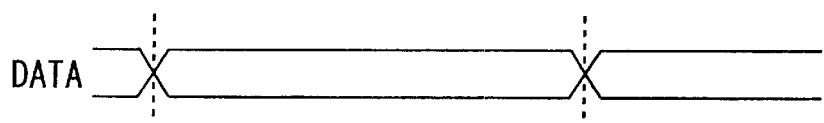
FIG. 4B  A; 
FIG. 4C  B; CLK 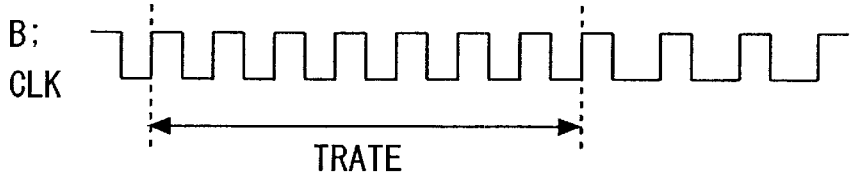
TRATE FIG. 5
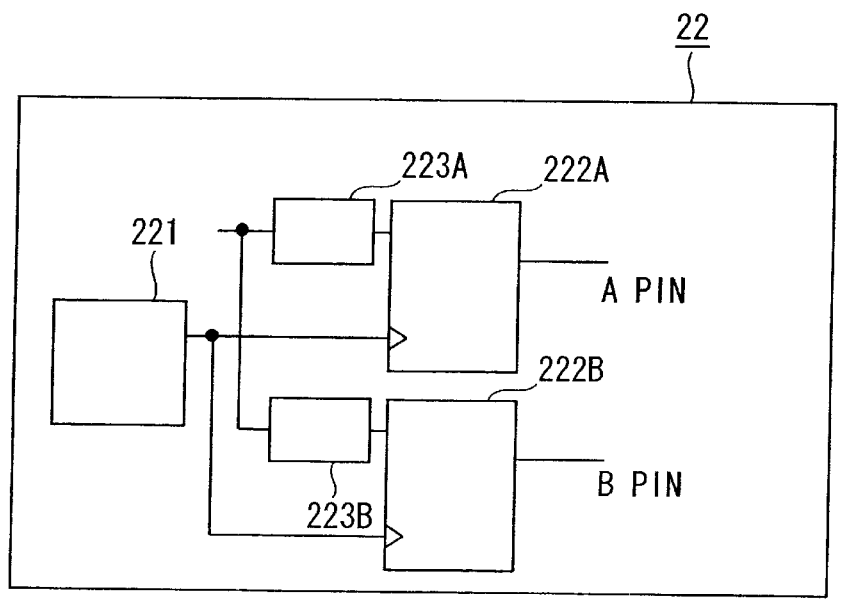
FIG. 6A CLOCK 
FIG. 6B COUNT VALUE 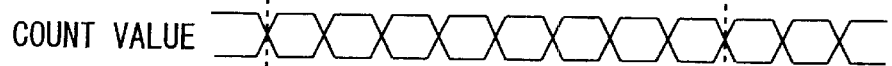
FIG. 6C A PIN 
FIG. 6D B PIN 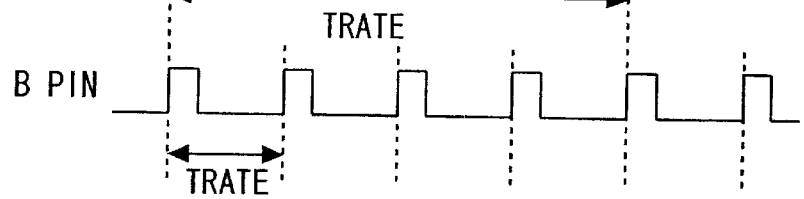

FIG. 11A PRIOR ART CLOCK
FIG. 11B PRIOR ART COUNT VALUE
FIG. 11C PRIOR ART CONTROL SIGNAL
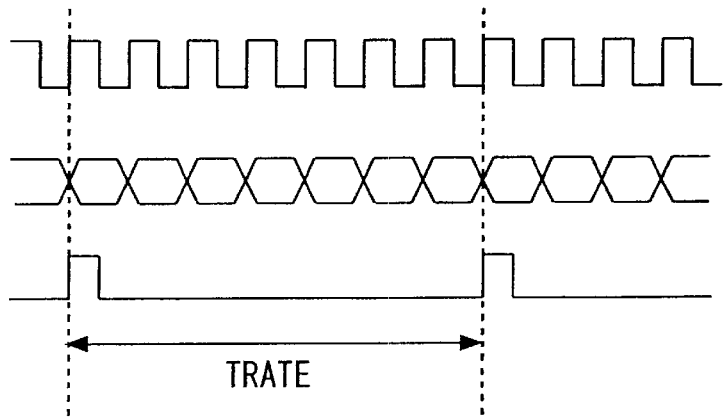
FIG. 12A PRIOR ART DATA
FIG. 12B PRIOR ART CLK
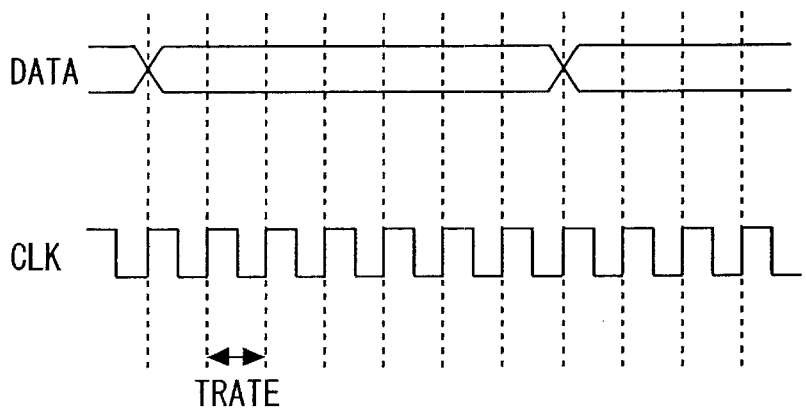

US 6,522,126 B1

SEMICONDUCTOR TESTER, AND METHOD OF TESTING SEMICONDUCTOR USING THE SAME

BACKGROUND OF THE INVENTION

1. Field of the Invention

The present invention relates to a semiconductor tester, and more particularly, to a semiconductor tester which can supply a high-speed clock signal at a low-speed test cycle, as well as to a method of testing a semiconductor using the semiconductor tester.

2. Background Art

FIGS. 7 through 12 show a commonly-employed tester for testing a semiconductor element. FIG. 7 is a schematic representation showing the relationship between a semiconductor element and a semiconductor tester at the time of testing of the semiconductor element. FIG. 8 is a block diagram showing the configuration of a semiconductor tester. FIG. 9 is a schematic representation showing the configuration of a reference-signal-generation circuit. FIG. 10 is a block diagram showing the configuration of a waveform formation circuit. FIGS. 11A through 11C are timing charts representing signal waveforms which arise in the individual sections of the reference-signal-generation circuit. FIGS. 12A and 12B are timing charts representing the signal waveforms which arise in the individual sections of the waveform formation circuit.

In FIG. 7, reference numeral 1 designates a semiconductor element which is an object of measurement (hereinafter referred to as a "semiconductor element to be measured"); 2 designates a semiconductor tester; and 3 designates a device interface board for establishing an interface between the semiconductor tester and the semiconductor element to be measured. As shown in FIG. 8, which illustrates the configuration of the semiconductor tester 2, reference numeral 21 designates a CPU for controlling the entirety of a semiconductor tester; 22 designates a reference-signal-generation circuit for producing a test cycle which serves as a reference-signal of the semiconductor tester; 23 designates a waveform formation circuit for producing a desired waveform from the reference-signal; 24 designates a waveform output circuit for shaping a produced waveform into an output waveform of a set voltage; and 25 designates a power circuit for supplying a supply voltage to the device interface board 3, the semiconductor element 1, and a CPU or for measuring a DC voltage.

As shown in FIG. 9, which illustrates the configuration of the reference-signal-generation circuit 22 of the semiconductor tester, reference numeral 221 designates a reference-clock-signal generation circuit; and 222 designates a counter circuit which counts up a reference clock, produces a test cycle control signal when the resultant count value reaches a predetermined setting, and takes the thus-produced test cycle control signal as a test cycle. A test cycle is determined by means of determining a setting of the counter circuit.

As shown in FIG. 10, which illustrates the configuration of the waveform formation circuit 23, reference numeral 231 designates a timing signal generation circuit for producing leading and trailing edges at predetermined timings on the basis of the test cycle produced by the reference-signal-generation circuit 22; 232 designates a test-pattern storage circuit for storing a test pattern code; and 233 designates a waveform composition circuit for producing the geometry of a waveform on the basis of a timing edge of the timing signal generation circuit and on the basis of a test pattern code stored in a test-pattern storage circuit. The voltage of a waveform having the geometry formed by the waveform composition circuit 233 is set by the waveform output circuit 24, and the waveform is output as a signal.

The operation of a commonly-used semiconductor tester will now be described.

A test cycle is prepared by the reference-signal-generation circuit 22 of the semiconductor tester 2. More specifically, the counter circuit 222 counts up a reference clock signal which is shown in FIG. 11A and is prepared by the reference-clock-signal generation circuit 221 of the reference-signal-generation circuit 22. If, as shown in FIG. 11B, the resultant count value becomes equal to a predetermined setting, a test cycle control signal as shown in FIG. 11C is produced. The thus-produced test cycle control signal is taken as a test cycle. On the basis of the test cycle, the waveform formation circuit 23 produces geometry of an output waveform. More specifically, as shown in FIG. 12A, leading and trailing edges are produced on the basis of the test cycle produced by the reference-signal-generation circuit 22 and at timings set by the timing signal generation circuit 231. On the basis of the leading and trailing edges and a test pattern code stored in the test-pattern storage circuit 232, the waveform composition circuit 233 produces the geometry of a waveform, as shown in FIG. 12B. The waveform output circuit 24 sets the voltage of a waveform having the thus-formed geometry and outputs the waveform as a signal.

At this time, a given test cycle is assigned to all tester pins, and the number of leading and trailing edges of a waveform which can be set within one test cycle is determined for each semiconductor tester. If an attempt is made to produce a clock signal, a clock cycle is limited by the test cycle.

A commonly-used semiconductor tester has a structure as set forth. In a case of testing, through use of the test circuit, of a component of internal circuits (EPROM, ADC, and DAC) of a system LSI and the component operating slower than the operation clock of a CPU, the test cycle to be set in a semiconductor test must be set to the fastest cycle. Such setting is also necessary in a case where a test circuit mounted on a device interface board to be used for a system LSI operates slower than the operation clock of the CPU, and a device is tested through use of the test circuit.

If a test pattern is prepared at this time, the test pattern must be lengthy, because the test pattern is prepared in step with the fastest cycle. Further, storage capacity of a test-pattern storage circuit must become enormous so as to be able to reserve the lengthy test pattern. Although an actual control cycle is of low speed, the operation clock of the CPU is of high speed. Therefore, there is demand for a high-speed semiconductor tester capable of sufficiently producing a control cycle equal to that of the operation clock. If a semiconductor device is tested through use of a high-speed semiconductor tester having a large amount of memory for storing a test pattern, total testing costs become excessive.

SUMMARY OF THE INVENTION

The present invention has been conceived to solve such a drawback of the background art and is aimed at providing a low-cost semiconductor tester which saves memory space for storing a test pattern, by means of producing a high-speed clock while preparing a test pattern at a low-speed test cycle and which has a test-pattern storage circuit of small storage capacity, as well as a semiconductor test method using the semiconductor tester.

According to a first aspect of the present invention, there is provided a semiconductor tester comprising: a referencesignal-generation circuit for producing a test cycle to be taken as a reference-signal; a waveform formation circuit for producing the geometry of an output waveform on the basis of the test cycle; and a waveform output circuit which sets the voltage of the geometry of the output waveform and applies the voltage to a semiconductor element to be measured, wherein, in said waveform formation circuit, a ring oscillation circuit having a variable delay circuit is provided and converts the output waveform, which waveform is produced at a predetermined timing, into a high-speed clock waveform.

According to a second aspect of the present invention, there is provided a semiconductor tester comprising: a reference-signal-generation circuit for producing a test cycle to be taken as a reference-signal; a waveform formation circuit for producing the geometry of an output waveform on the basis of the test cycle; and a waveform output circuit which sets the voltage of the geometry of the output waveform and applies the voltage to a semiconductor element to be measured, wherein said reference-signal-generation circuit including: a reference-clock-signal generation circuit for producing a reference clock signal; a counter circuit which counts up the number of reference clock signals and produces a test cycle control signal when the resultant count value reaches a predetermined setting; a setting-value generation circuit for producing a setting value of said counter circuit; and a setting-value control circuit which is connected to said setting-value generation circuit, as required, and multiplies the setting value by an arbitrary value.

According to a third aspect of the present invention, there is provided a semiconductor testing method for use with a semiconductor tester having a reference-signal-generation circuit for producing a test cycle to be taken as a reference-signal, a waveform formation circuit for producing the geometry of an output waveform on the basis of the test cycle, and a waveform output circuit which sets the voltage of the geometry of the output waveform and applies the voltage to a semiconductor element to be measured, the method comprising the steps of: producing a pulse waveform at a programmed timing and on the basis of the test cycle; commencing ring oscillation at a predetermined delay value while the pulse waveform is taken as an input; and outputting a high-speed clock signal to the semiconductor element.

The above and other objects, effects, features and advantages of the present invention will become more apparent from the following description of the embodiments thereof taken in conjunction with the accompanying drawings.

BRIEF DESCRIPTION OF THE DRAWINGS

FIG. 1 is a block diagram showing the configuration of a waveform formation circuit, which circuit constitutes the principal section of the semiconductor tester according to the EMBODIMENT 1.

FIG. 2 is a timing chart showing signal waveforms developing in individual sections of the waveform formation circuit shown in FIG. 1.

FIG. 3 is a block diagram showing the configuration of a waveform formation circuit, the circuit constituting the principal section of the semiconductor tester according to the EMBODIMENT 2.

FIGS. 4A through 4C are timing charts of signal waveforms developing in individual sections of the waveform formation circuit shown in FIG. 3.

FIG. 5 is a block diagram showing the configuration of a reference-signal-generation circuit, the circuit constituting the principal section of the semiconductor tester of the present embodiment.

FIGS. 6A through 6*d* are timing charts showing signal waveforms developing in individual sections of the reference-signal-generation circuit shown in FIG. 5.

FIGS. 11A through 11C are timing charts representing signal waveforms which arise in the individual sections of the reference-signal-generation circuit.

FIGS. 12A and 12B are timing charts representing the signal waveforms which arise in the individual sections of the waveform formation circuit.

DETAILED DESCRIPTION OF THE PREFERRED EMBODIMENTS

Figure 7:
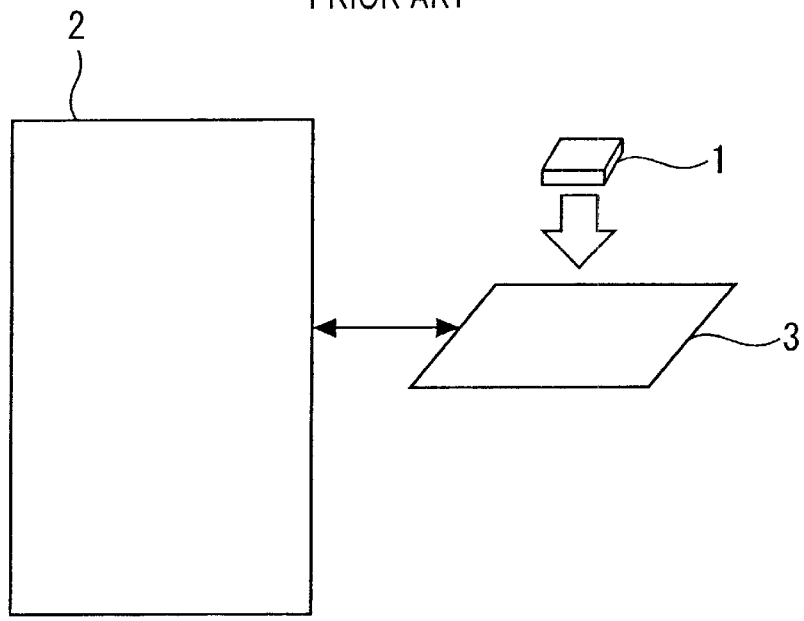
FIG. 7 is a schematic representation showing the relationship between a semiconductor element and a semiconductor tester at the time of testing of the semiconductor element.

Embodiments of the present invention will be described below with reference to the accompanying drawings. It is noted that the same reference symbols in the drawings denote the same or corresponding components.

EMBODIMENT 1

A semiconductor tester according to the present invention will be described hereinbelow by reference to FIG. 1.

Figure 8:
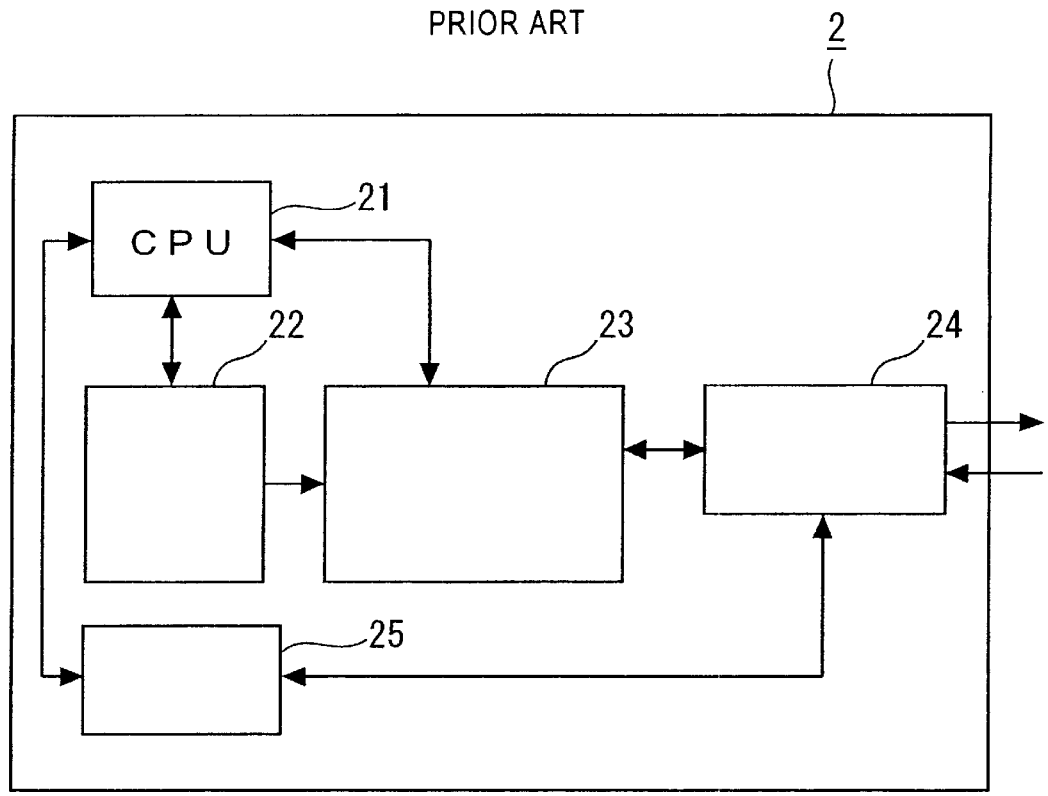
FIG. 8 is a block diagram showing the configuration of a semiconductor tester.
Figure 9:
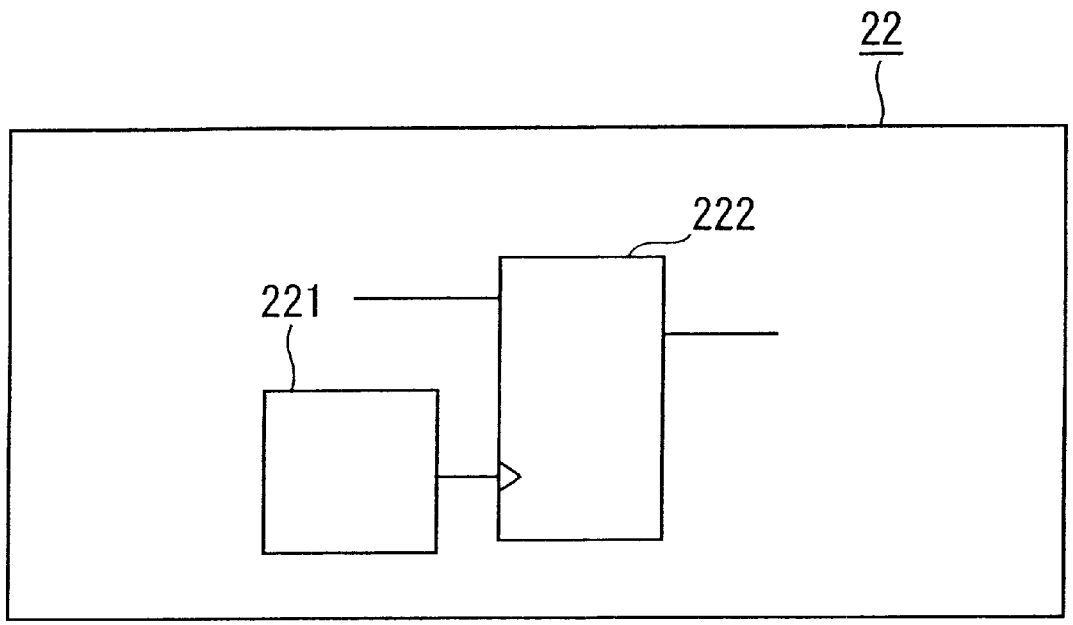
FIG. 9 is a schematic representation showing the configuration of a reference-signal-generation circuit.

The semiconductor tester is analogous in overall structure with that shown in FIGS. 7 and 8. The semiconductor tester according to the EMBODIMENT 1 is characterized by the configuration of a waveform formation circuit or reference-signal-generation circuit.

FIG. 1 is a block diagram showing the configuration of a waveform formation circuit, which circuit constitutes the principal section of the semiconductor tester according to the EMBODIMENT 1. FIG. 2 is a timing chart showing signal waveforms developing in individual sections of the waveform formation circuit shown in FIG. 1.

Figure 10:
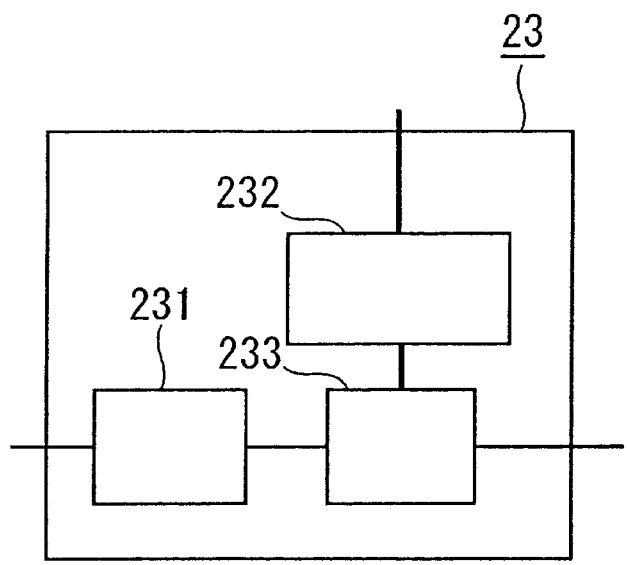
FIG. 10 is a block diagram showing the configuration of a waveform formation circuit.

In FIG. 1, those elements which are identical with or correspond to those shown in FIGS. 7 and 10 are assigned the same reference numerals, and repetition of their explanations is omitted. The waveform formation circuit shown in FIG. 1 differs from that shown in FIG. 10 in that a ring oscillation circuit is connected to an output terminal of a waveform composition circuit 233 and that a control circuit for setting a delay value of the oscillation circuit is connected to the ring oscillation circuit.

As shown in FIG. 1, reference numeral 234 designates a ring oscillation circuit having a variable delay circuit 234A, and 235 designates a control circuit for setting and controlling a delay value of the variable delay circuit.

The operation of the semiconductor tester according to the EMBODIMENT 1 will be described by reference to the signal waveforms shown in FIGS. 2A through 2C.

The waveform composition circuit 233 produces a pulse waveform A shown in FIG. 2B on the basis of a timing edge produced by the timing signal generation circuit 231 and the test pattern output from a test-pattern storage circuit 232.

The pulse waveform A is input to the ring oscillation circuit 234 having the variable delay circuit 234A, and a delay value of the variable delay circuit 234A is set by the control circuit 235, wherewith a known ring oscillation operation is commenced. As a result, a high-speed clock signal B shown in FIG. 2C is output. These operations can be set for each of output pins of the semiconductor tester, and no influence is imposed on a test cycle.

If a pulse waveform develops in the next cycle, a clock signal produced by means of the oscillating operation of the ring oscillation circuit is stopped, thus preventing impediments to the next ring oscillating operation of the ring oscillation circuit. A clock signal output from the ring oscillation circuit 234 is delivered to a semiconductor element to be measured, by way of a waveform output circuit 24 shown in FIG. 8 and the device interface board 3.

By virtue of the above-described configuration of the semiconductor tester, the semiconductor tester can produce a high-speed clock signal while a low-speed test cycle is retained. In a case of testing of a component of internal circuits (EPROM, ADC, DAC, or like circuits) of a system LSI and the A component operating slower than the operation clock of a CPU, or in a case where a test circuit mounted on a device interface board for testing a system LSI operates slower than the operation clock of a CPU and a device is tested through use of the test circuit, a necessity for preparing a test pattern at a high-speed test cycle in step with the clock of a CPU is eliminated. Since a test pattern can be prepared at a slow-speed test cycle, the storage capacity of a test-pattern storage circuit can be efficiently utilized. For example, in a case where a system LSI equipped with a CPU having a clock speed of 100 MHz is tested at a test cycle of 1 MHz, a commonly-used semiconductor tester must employ a test cycle of 100 MHz. In contrast, the semiconductor tester according to the present embodiment can perform a test at a test cycle of 1 MHz. As a result, the storage capacity required for reserving a test pattern is reduced to one-hundredth that required by a test-pattern storage circuit of the commonly-used semiconductor tester. Thus, the storage capacity of the test-pattern storage circuit can be saved considerably. Although a CPU clock cycle of 100 MHz and a test cycle of 1 MHz are employed in the present embodiment, the present invention is not limited thereto.

In the present embodiment, since a highs-speed clock signal can be produced during a low-speed test cycle, a semiconductor element equipped with a CPU, the CPU requiring a high-speed clock signal, can be tested through use of a low-cost, low-speed semiconductor tester. The present invention yields an effect of curtailing testing costs. As a result, testing a system LSI equipped with a CPU, the CPU requiring a high-speed clock signal, does not require use of a high-speed semiconductor tester having a test-pattern storage circuit of vast capacity. The system LSI can be tested through use of a low-speed, low-cost semiconductor tester of small test-pattern storage capacity. Thus, the present invention yields an advantage of the ability to curtail total testing costs.

EMBODIMENT 2

A semiconductor tester according to EMBODIMENT 2 of the present invention will now be described by reference to corresponding drawings.

FIG. 3 is a block diagram showing the configuration of a waveform formation circuit, the circuit constituting the principal section of the semiconductor tester according to the EMBODIMENT 2. FIGS. 4A through 4C are timing charts of signal waveforms developing in individual sections of the waveform formation circuit shown in FIG. 3. In FIG. 3, those elements which are identical with or correspond to those employed in FIG. 1 are assigned the same reference numerals, and repetition of their explanations is omitted.

In contrast with the semiconductor tester shown in FIG. 1, the semiconductor tester according to the EMBODIMENT 2 is provided with a delay-value storage circuit and a delay-value control circuit, in place of the control circuit 235.

As shown in FIG. 3, reference numeral 236 designates a delay-value storage circuit for storing a delay value to be set in a variable delay circuit 234A; and 237 designates a delay-value control circuit for controlling the delay-value storage circuit 236.

The operation of the semiconductor tester according to the present embodiment will now be described by reference to signal waveforms shown in FIGS. 4A through 4C.

When a timing edge signal, which is produced by the timing-signal generation circuit 231 and is shown in FIG. 4A, enters the delay-value control circuit 237, the delay-value control circuit 237 controls the delay-value storage circuit 236, to thereby set a delay value in a variable delay circuit 234A which determines a ring oscillation cycle of a test vector (i.e., an input pattern and an expected-value pattern). Until a next timing edge signal is output from the timing generation circuit 231, a ring oscillation operation is performed at the thus-set delay value, to thereby produce a clock signal B shown in FIG. 4C.

When the next timing edge signal is output from the timing signal generation circuit 231, the delay-value control circuit 237 again controls the delay-value storage circuit 236, wherewith a new delay value is set in the variable delay circuit 234A. As a result, every time the timing generation circuit 231 produces a timing edge signal, the delay value to be set in the variable delay circuit 234A is changed. Accordingly, the ring oscillation cycle of the ring oscillation circuit 234 is changed every test vector, and a clock cycle can be set for each test vector.

The above-described configuration of the semiconductor tester yields the same advantage as that yielded by the EMBODIMENT 1, and an arbitrary clock cycle can be set for each test vector. Accordingly, the present embodiment yields an advantage of the ability to dramatically reduce the storage capacity of a test-pattern storage circuit.

EMBODIMENT 3

A semiconductor tester according to EMBODIMENT 3 of the present invention will now be described.

Of the components of the waveform formation circuit 23 shown in FIG. 1, at least the ring oscillation circuit 234 and the control circuit 235 are mounted on the device interface board 3. Further, the clock speed of the pulse waveform produced at a low-speed test cycle is changed to a high-speed clock signal within the device interface board 3. As a result, a high-speed clock signal is achieved at a low-speed test cycle, and the present embodiment yields the same advantage as that yielded by the EMBODIMENT 1.

EMBODIMENT 4

A semiconductor tester according to EMBODIMENT 4 of the present invention will now be described by reference to the accompanying drawings.

FIG. 5 is a block diagram showing the configuration of a reference-signal-generation circuit, the circuit constituting the principal section of the semiconductor tester of the present embodiment. FIGS. 6A through 6d are timing charts showing signal waveforms developing in individual sections of the reference-signal-generation circuit shown in FIG. 5.

As shown in FIG. 5, reference numeral 221 designates a reference-clock-signal generation circuit for producing a clock signal, the signal serving as the reference of the semiconductor tester; 222A and 222B designate counter circuits, each counter circuit producing a test cycle control signal when a resultant count value reaches a predetermined setting of the counter circuit as a result of the reference clock signal being counted by the counter circuit; and 223A and 223B designate setting-value control circuits. The setting-value control circuits 223A and 223B are connected to respective setting-value generation circuits of the counter circuits 222A and 222B, as required. Each of the setting-value control circuits 223A and 223B multiplies a setting value by an arbitrary value and delivers the thus-multiplied setting value to the counter circuit. The reference-signal-generation circuit is to be used with a semiconductor tester (per-pin tester), in which a test cycle signal generation circuit is provided for each tester pin. Further, the setting-value control circuits 223A and 223B may be provided for respective tester pins or for a specific tester pin.

The operation of the semiconductor tester according to the EMBODIMENT 4 of will now be described by reference to signal waveforms shown in FIGS. 6A through 6D.

On the basis of the reference clock signal output from the reference-clock-signal generation circuit 221, the counter circuits 222A and 222B commence count-up operations. A counter setting set by a test program is set in each of the counter circuits 222A and 222B as a setting common to all tester pins. In a case where assignment of a different counter setting to an arbitrary pin is desired, the multiplication factor of either the setting-value control circuit 223A or the setting-value control circuit 223B, the setting-value control circuit being assigned to the arbitrary pin, is individually changed to an arbitrary value, thereby enabling individual setting of a counter value of the respective counter circuit.

Thus, a different counter value is assigned to each tester pin, and a different test cycle can be produced on a per-pin basis.

Since a different test cycle can be assigned to an arbitrary pin, a low-speed test cycle and a high-speed test cycle can be produced simultaneously.

In a case of testing of a component of internal circuits (EPROM, ADC, DAC, or like circuits) of a system LSI, the component operating slower than the operation clock of a CPU, or in a case where a test circuit mounted on a device interface board for testing a system LSI operates slower than the operation clock of a CPU and a device is tested through use of the test circuit, a necessity for preparing a test pattern at a high-speed test cycle in step with the clock of a CPU is eliminated. Since a test pattern can be prepared at a slow-speed test cycle, the storage capacity of a test-pattern storage circuit can be efficiently utilized. Further, the present invention eliminates a necessity for using a semiconductor tester having a test-pattern storage circuit of enormous storage capacity, and hence a low-cost semiconductor tester having a small amount of test-pattern storage capacity can be used, thereby curtailing total testing costs.

A semiconductor tester including a reference-signal-generation circuit for producing a test cycle to be taken as a reference-signal, a waveform formation circuit for producing the geometry of an output waveform on the basis of the test cycle, and a waveform output circuit which sets the voltage of the geometry of the output waveform and applies the voltage to a semiconductor element to be measured, the tester comprising: a ring oscillation circuit which is provided in the waveform formation circuit, has a variable delay circuit, and converts the output waveform, which waveform is produced at a predetermined timing, into a high-speed clock waveform. As a result, a high-speed clock signal can be produced while a test cycle is maintained at low speed.

In a case of testing of a component of internal circuits (EPROM, ADC, DAC, or like circuits) of a system LSI, the component operating slower than the operation clock of a CPU, or in a case where a test circuit mounted on a device interface board for testing a system LSI operates slower than the operation clock of a CPU and a device is tested through use of the test circuit, a necessity for preparing a test pattern at a high-speed test cycle in step with the clock of a CPU is eliminated. Since a test pattern can be prepared at a slow-speed test cycle, the storage capacity of a test-pattern storage circuit can be efficiently utilized.

Further, since a high-speed clock signal can be produced during a low-speed test cycle, a semiconductor element whose CPU requires a high-speed clock signal can be tested through use of a low-cost, low-speed semiconductor tester, thereby curtailing test costs.

As a result, testing a system LSI equipped with a CPU, the CPU requiring a high-speed clock signal, does not require use of a high-speed semiconductor tester having a test-pattern storage circuit of vast capacity. The system LSI can be tested through use of a low-speed, low-cost semiconductor tester of small test-pattern storage capacity. Hence, the present invention yields an advantage of the ability to curtail total test costs.

Preferably, the waveform formation circuit comprises: a ring oscillation circuit equipped with a variable delay circuit; a delay-value storage circuit for storing a delay value to be set in the variable delay circuit; and a delay-value control circuit which controls the delay storage circuit every time a timing edge signal is produced on the basis of the test cycle and which sets a predetermined delay value into the variable delay circuit. Accordingly, an arbitrary clock cycle can be set for each test vector, and the present embodiment can dramatically reduce the storage capacity of a test-pattern storage circuit.

Preferably, the reference-signal-generation circuit comprises a reference-clock-signal generation circuit for producing a reference clock signal; a counter circuit which counts up the number of reference clock signals and produces a test cycle control signal when the resultant count value reaches a predetermined setting; a setting-value generation circuit for producing a setting value of the counter circuit; and a setting-value control circuit which is connected to the setting-value generation circuit, as required, and multiplies the setting value by an arbitrary value. Accordingly, a different test cycle can be produced for an arbitrary pin, and a low-speed test cycle and a high-speed test cycle can be produced simultaneously.

In a case of testing of a component of internal circuits (EPROM, ADC, DAC, or like circuits) of a system LSI, the component operating slower than the operation clock of a CPU, or a case where a test circuit mounted on a device interface board for testing a system LSI operates slower than the operation clock of a CPU and a device is tested through use of the test circuit, a necessity for preparing a test pattern at a high-speed test cycle in step with the clock of a CPU is eliminated. Since a test pattern can be prepared at a slow-speed test cycle, the storage capacity of a test-pattern storage circuit can be efficiently utilized. Further, a high-speed clock signal can be produced during a low-speed test cycle, a semiconductor element whose CPU requires a high-speed clock signal can be tested through use of a low-cost semiconductor tester, thereby curtailing testing costs. Hence, the present invention yields an advantage of the ability to curtail total test costs.

According to a semiconductor test method of the present invention, the method comprises the steps of producing a pulse waveform at a programmed timing and on the basis of the test cycle; commencing ring oscillation at a predetermined delay value while the pulse waveform is taken as an input; and outputting a high-speed clock signal to the semiconductor element.

In a case of testing of a component of internal circuits (EPROM, ADC, DAC, or like circuits) of a system LSI, the component operating slower than the operation clock of a CPU, or a case where a test circuit mounted on a device interface board for testing a system LSI operates slower than the operation clock of a CPU and a device is tested through use of the test circuit, a necessity for preparing a test pattern at a high-speed test cycle in step with the clock of a CPU is eliminated. Since a test pattern can be prepared at a slow-speed test cycle, the storage capacity of a test-pattern storage circuit can be efficiently utilized.

Preferably, a counter circuit is provided for each tester pin, and different test cycles are assigned to individual tester pins or to a specific tester pin. Accordingly, a different test cycle can be assigned to an arbitrary pin, and a low-speed test cycle and a high-speed test cycle can be produced simultaneously.

Moreover, a necessity for using a semiconductor tester having a test-pattern storage circuit of vast capacity is eliminated, and a low-cost semiconductor tester of small test-pattern storage capacity can be used, thereby curtailing total testing costs.

Here, the semiconductor tester may further comprise a control circuit for setting a delay value of the variable delay circuit.

A semiconductor tester comprising: a reference-signal-generation circuit for producing a test cycle to be taken as a reference-signal; a waveform formation circuit for producing the geometry of an output waveform on the basis of the test cycle; and a waveform output circuit which sets the voltage of the geometry of the output waveform and applies the voltage to a semiconductor element to be measured by way of a device interface board, wherein, in the device interface board, a ring oscillation circuit having a variable delay circuit is provided and converts the output waveform, which waveform is produced at a predetermined timing, into a high-speed clock waveform.

A semiconductor tester comprising: a reference-signal-generation circuit for producing a test cycle to be taken as a reference-signal; a waveform formation circuit for producing the geometry of an output waveform on the basis of the test cycle; and a waveform output circuit which sets the voltage of the geometry of the output waveform and applies the voltage to a semiconductor element to be measured, wherein said waveform formation circuit including: a ring oscillation circuit equipped with a variable delay circuit; a delay-value storage circuit for storing a delay value to be set in the variable delay circuit; and a delay-value control circuit which controls said delay-value storage circuit every time a timing edge signal is produced on the basis of the test cycle and which sets a predetermined delay value into the variable delay circuit.

In the semiconductor tester, a plurality of counter circuits may be provided, and a setting-value control circuit may be provided in each of the counter circuits, each of the setting-value control circuits being provided with a different setting value.

In the semiconductor tester, a plurality of counter circuits may be provided, and only a specific counter circuit may be provided with a setting-value control circuit, the specific counter circuit being provided with a test cycle that differs from those of the other counter circuits.

The semiconductor testing method for use with the semiconductor tester, the counter circuit may be provided for each tester pin, and different test cycles are assigned to individual tester pins or to a specific tester pin.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 2000-87019 filed on Mar. 27, 2000 including specification, claims, drawings and summary are incorporated herein by reference in its entirety.

What is claimed is:

1. A semiconductor tester comprising:
    a reference-signal-generation circuit for producing a test cycle to be taken as a reference-signal;
    a waveform formation circuit for producing the geometry of an output waveform on the basis of the test cycle; and
    a waveform output circuit which sets the voltage of the geometry of the output waveform and applies the voltage to a semiconductor element to be measured,
    wherein, in said waveform formation circuit, a ring oscillation circuit having a variable delay circuit is provided and converts the output waveform, which waveform is produced at a predetermined timing, into a high-speed clock waveform.

2. The semiconductor tester according to claim 1, further comprising a control circuit for setting a delay value of the variable delay circuit.

3. A semiconductor tester comprising:
    a reference-signal-generation circuit for producing a test cycle to be taken as a reference-signal;
    a waveform formation circuit for producing the geometry of an output waveform on the basis of the test cycle; and
    a waveform output circuit which sets the voltage of the geometry of the output waveform and applies the voltage to a semiconductor element to be measured,
    wherein said reference-signal-generation circuit including:
        a reference-clock-signal generation circuit for producing a reference clock signal;
        a counter circuit which counts up the number of reference clock signals and produces a test cycle control signal when the resultant count value reaches a predetermined setting;
        a setting-value generation circuit for producing a setting value of said counter circuit; and
        a setting-value control circuit which is connected to said setting-value generation circuit, as required, and multiplies the setting value by an arbitrary value.

4. The semiconductor tester according to claim 3, wherein a plurality of counter circuits are provided, and a setting-value control circuit is provided in each of the counter circuits, each of the setting-value control circuits being provided with a different setting value.

5. The semiconductor tester according to claim 3, wherein a plurality of counter circuits are provided, and only a specific counter circuit is provided with a setting-value control circuit, the specific counter circuit being provided with a test cycle that differs from those of the other counter circuits.

6. A semiconductor testing method for use with a semiconductor tester having a reference-signal-generation circuit for producing a test cycle to be taken as a reference-signal, a waveform formation circuit for producing the geometry of an output waveform on the basis of the test cycle, and a waveform output circuit which sets the voltage of the geometry of the output waveform and applies the voltage to a semiconductor element to be measured, the method comprising the steps of:

producing a pulse waveform at a programmed timing and on the basis of the test cycle;

commencing ring oscillation at a predetermined delay value while the pulse waveform is taken as an input; and outputting a high-speed clock signal to the semiconductor element.

* * * * *